United States Patent
Yun

(10) Patent No.: US 9,368,173 B1
(45) Date of Patent: Jun. 14, 2016

(54) SEMICONDUCTOR MEMORY DEVICE

(71) Applicant: SK hynix Inc., Gyeonggi-do (KR)

(72) Inventor: Tae-Sik Yun, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/713,812

(22) Filed: May 15, 2015

(30) Foreign Application Priority Data

Dec. 19, 2014 (KR) .......................... 10-2014-0184386

(51) Int. Cl.
*G11C 7/22* (2006.01)
*G11C 7/06* (2006.01)
*G11C 7/10* (2006.01)
*G11C 11/4076* (2006.01)

(52) U.S. Cl.
CPC .. *G11C 7/22* (2013.01); *G11C 7/06* (2013.01); *G11C 7/10* (2013.01); *G11C 11/4076* (2013.01)

(58) Field of Classification Search
CPC ....................................................... G11C 7/22

USPC .......................................................... 365/193
See application file for complete search history.

(56) References Cited

U.S. PATENT DOCUMENTS

| 2015/0124535 A1* | 5/2015 | Kim, II | G11C 7/1066 |
|---|---|---|---|
| | | | 365/189.05 |
| 2015/0200015 A1* | 7/2015 | Kim | G11C 16/08 |
| | | | 365/185.12 |

FOREIGN PATENT DOCUMENTS

| KR | 1020080037931 | 5/2008 |
|---|---|---|
| KR | 1020090072394 | 7/2009 |

* cited by examiner

*Primary Examiner* — Son Mai
(74) *Attorney, Agent, or Firm* — IP & T Group LLP

(57) ABSTRACT

A circuit of a semiconductor memory device may include a delay unit suitable for delaying a column pulse signal, and sequentially generating a first strobe source signal, a column source signal, and a second strobe source signal at a predetermined time interval, and an input/output strobe signal generation unit suitable for generating an input/output strobe signal which is activated during a period in which both of the first and second strobe source signals are activated.

15 Claims, 4 Drawing Sheets

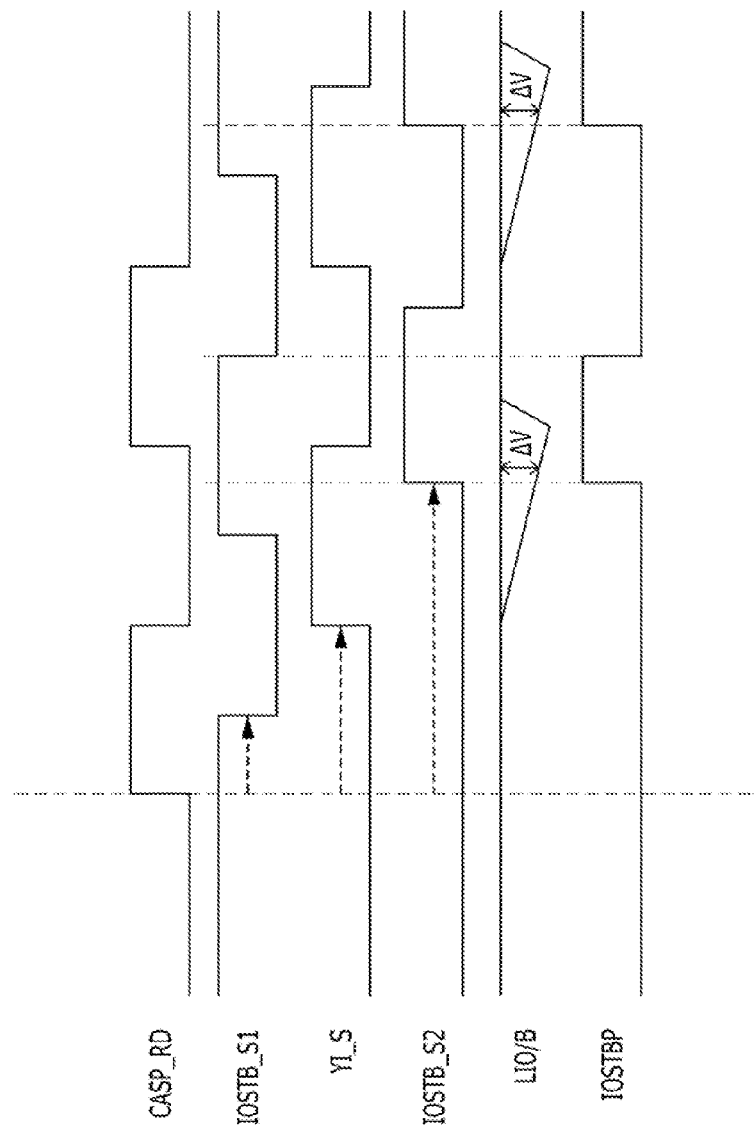

SEMICONDUCTOR MEMORY DEVICE

CROSS-REFERENCE TO RELATED APPLICATIONS

The present application claims priority of Korean Patent Application No. 10-2014-0184386, filed on Dec. 19, 2014, which is incorporated herein by reference in its entirety.

BACKGROUND

1. Field

This patent document relates to a semiconductor design technology, and more particularly, to a column control signal generation circuit of a semiconductor memory device, which generates an input/output strobe signal.

2. Description of the Related Art

A semiconductor memory device performs a write operation of storing data and a read operation of reading stored data. During the write operation, the semiconductor memory device transmits data loaded in a global input/output line (GIO) to a local input/output line (LIO) through a write driver when a corresponding word line (WL) is enabled by an active signal. Then, the semiconductor memory device transmits the data loaded in the local input/output line to an input/output sense amplification unit which is selected by a column select signal, and stores the data in a target memory cell. On the other hand, during the read operation, the semiconductor memory device amplifies data stored in a target memory cell through a bit line (BL) using the input/output sensing amplification unit, when a corresponding word line is enabled by an active signal. Then, the semiconductor memory device transmits the amplified data to the local input/output line using a column select signal, and the data is amplified through the input/output sense amplification unit. The input/output sense amplification unit transmits the data loaded in the local input/output line to the global input/output line in response to an input/output strobe signal. Then, the semiconductor memory device activates the input/output strobe signal when the data of the local input/output line is properly amplified, that is, when the local input/output line secures a voltage level difference ΔV for the data.

However, due to a change in delay amount which may be caused by a variety of process, voltage, and temperature variations, the conventional semiconductor memory device may activate the input/output strobe signal when a sufficient voltage level difference ΔV of the local input/output line is not secured. In this case, the reliability of the read operation of the semiconductor memory device may be degraded.

SUMMARY

Various embodiments are directed to a column control signal generation circuit of a semiconductor memory device, which is capable of generating an input/output strobe signal when a sufficient voltage level difference ΔV is secured between a local input/output line pair, even though a process, voltage, or temperature variation occurs.

In an embodiment, a circuit of a semiconductor memory device may include a delay unit suitable for delaying a column pulse signal, and sequentially generating a first strobe source signal, a column source signal, and a second strobe source signal at predetermined time intervals; and an input/output strobe signal generation unit suitable for generating an input/output strobe signal which is activated during a period in which both of the first and second strobe source signals are activated.

The delay unit may generate the first strobe source signal, the column source signal, and the second strobe source signal by delaying the column pulse signal by first to third delay times, respectively.

The first delay time may be less than the second delay time, and the second delay time is less than the third delay time.

The first strobe source signal, the column source signal, and the second strobe source signal may be activated at different times, and the column source signal is activated prior to the second strobe source signal.

The first strobe source signal may have the opposite phase of the column pulse signal; and the column source signal and the second strobe source signal have the same phase as the column pulse signal.

The delay unit may comprise an Inverter chain.

The input/output strobe signal generation unit may include a first NAND gate suitable for performing a NAND operation on the first strobe source signal and the second strobe source signal; a second NAND gate suitable for performing a NAND operation on an output signal of the first NAND gate and a read control signal; and a third NAND gate suitable for performing a NAND operation on an output signal of the second NAND gate and a strobe control signal to output the input/output strobe signal.

In an embodiment, a semiconductor memory device may include a column control signal generation unit suitable for generating an input/output strobe signal which is activated in response to first and second strobe source signals obtained by delaying a column pulse signal by predetermined delay times, respectively, and a column source signal which is activated prior to the second strobe source signal; a column select signal generation unit suitable for generating a column select signal corresponding to a column address in response to the column source signal; and an input/output sense amplification unit suitable for sensing and amplifying data signals of a local input/output line pair in response to the input/output strobe signal.

The column control signal generation unit may include: a delay unit suitable for delaying the column pulse signal by first to third delay times, respectively, and sequentially generating the first strobe signal, the column source signal, and the second strobe source signal at predetermined time intervals; and an input/output strobe signal generation unit suitable for generating the input/output strobe signal which is activated during a period in which both of the first and second strobe source signals are activated, in response to the first and second strobe source signals.

The first strobe source signal may have the opposite phase of the column pulse signal; and the column source signal and the second strobe source signal have the same phase as the column pulse signal.

The delay unit may comprise an inverter chain.

The input/output strobe signal generation unit may include: a first NAND gate suitable for performing a NAND operation on the first strobe source signal and the second strobe source signal; a second NAND gate suitable for performing a NAND operation on an output signal of the first NAND gate and a read control signal; and a third NAND gate suitable for performing a NAND operation on an output signal of the second NAND gate and a strobe control signal to output the input/output strobe signal.

The third NAND gate may output the output signal of the second NAND gate as the input/output strobe signal when the strobe control signal is activated; and a cycle of the strobe control signal is set to adjust a pulse width of the input/output strobe signal.

In an embodiment, an operating method of a semiconductor memory device may include: delaying a column pulse signal by a first delay time, and generating a first strobe source signal having the opposite phase of the column pulse signal; delaying the column pulse signal by a second delay time, and generating a column source signal having the same phase as the column pulse signal; delaying the column pulse signal by a third delay time, and generating a second strobe source signal having the same phase as the column pulse signal; and activating an input/output strobe signal during a period in which both of the first and second strobe source signals are activated.

The first delay time may be less than the second delay time, and the second delay time is less than the third delay time.

BRIEF DESCRIPTION OF THE DRAWINGS

FIG. 4 is an operation timing diagram of the column control signal generation unit illustrated in FIG. 2 when a low power supply voltage is supplied thereto.

DETAILED DESCRIPTION

Figure 1:
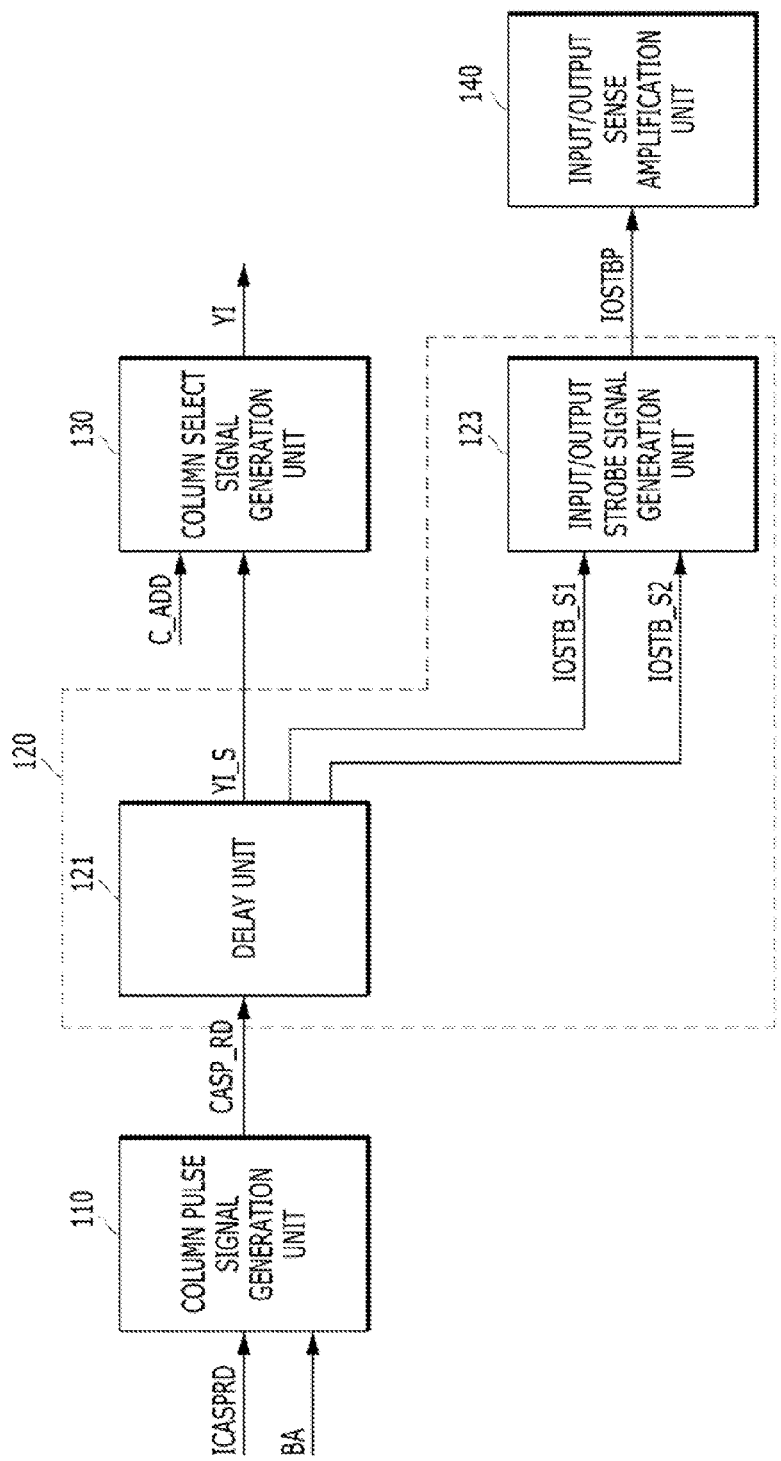
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements if there is no specific limitation. The terms of a singular form may include plural forms unless otherwise stated.

FIG. 1 is a block diagram illustrating a semiconductor memory device in accordance with an embodiment of the present invention.

Referring to FIG. 1, the semiconductor memory device may include a column pulse signal generation unit 110, a column control signal generation unit 120, a column select signal generation unit 130, and an input/output sense amplification unit 140.

The column pulse signal generation unit 110 may receive a bank address BA and an internal column read signal ICASPRD, which is activated in response to a read command, adjust the pulse width of the internal column read signal ICASPRD, and output a column pulse signal CASP_RD corresponding to the activated bank address BA.

The column control signal generation unit 120 may include a delay unit 121 and an input/output strobe signal generation unit 123.

The delay unit 121 may generate a first strobe source signal IOSTB_S1 by delaying the column pulse signal CASP_RD received from the column pulse signal generation unit 110 by a first delay time, generate a column source signal YI_S by delaying the column pulse signal CASP_RD by a second delay time, and generate a second strobe source signal IOSTB_S2 by delaying the column pulse signal CASP_RD by a third delay time. The first strobe source signal IOSTB_S1 may be generated prior to the column source signal YI_S, and the column source signal YI_S may be generated prior to the second strobe source signal IOSTB_S2. The first strobe source signal IOSTB_S1 may have the opposite phase of the column pulse signal CASP_RD, and the second strobe source signal IOSTB_S2 may have the same phase as the column pulse signal CASP_RD.

The input/output strobe signal generation unit 123 may generate an input/output strobe signal IOSTBP when both of the first and second strobe source signals IOSTB_S1 and IOSTB_S2 are activated.

The column select signal generation unit 130 may generate a column select signal YI by decoding a column address C_ADD received from outside at a period in which the column source signal YI_S is activated. In response to the column select signal YI, read data may be transmitted to a local input/output line pair (not illustrated). The column select signal YI may be used to control a bit line and a data input/output line to be electrically coupled to each other during a read or write operation.

The input/output sense amplification unit 140 may transmit the read data loaded in the local input/output line pair (not illustrated) to a global input/output line (not illustrated) in response to the input/output strobe signal IOSTBP.

The semiconductor memory device in accordance with the embodiment of the present invention may generate the input/output strobe signal IOSTBP when both of the first and second strobe signals IOSTB_S1 and IOSTB_S2 are activated. As the column source signal YI_S is generated prior to the second strobe source signal IOSTB_S2, the input/output strobe signal IOSTBP may be activated at a period in which the column source signal YI_S is activated. Thus, the input/output strobe signal generation unit 123 may generate the input/output strobe signal IOSTBP when a sufficient voltage level difference $\Delta V$ is secured between the local input/output line pair.

The input/output sense amplification unit 140 may be driven in response to the input/output strobe signal IOSTBP which is activated when a sufficient voltage level difference $\Delta V$ is secured between the local input/output line pair (not Illustrated). Thus, valid data of the local input/output line pair may be transmitted to a global input/output line (not illustrated), and the data transmitted to the global input/output line may be outputted to the outside.

Figure 2:
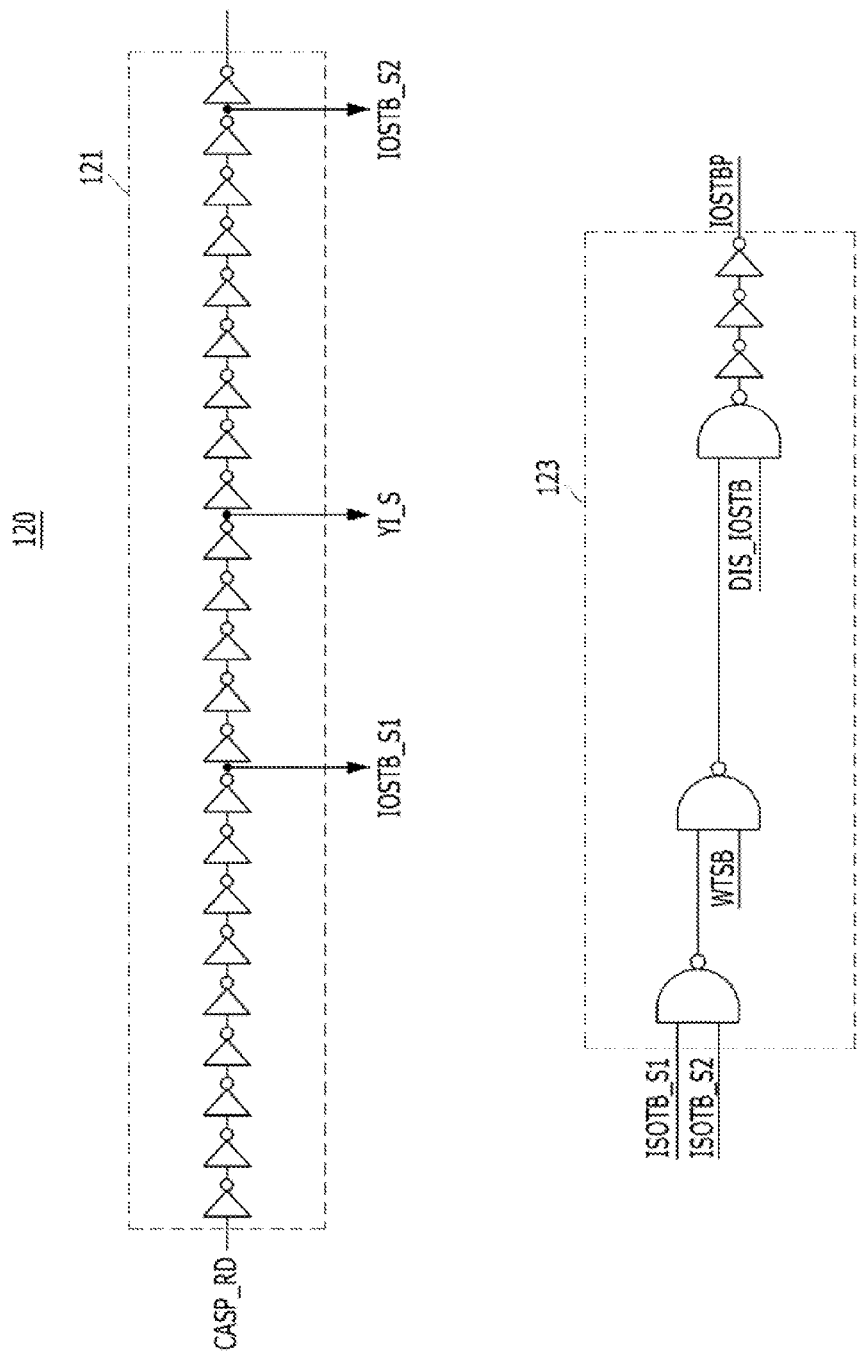
FIG. 2 is a detailed block diagram of a column control signal generation unit illustrated in FIG. 1.

FIG. 2 is a detailed block diagram of the column control signal generation unit 120 illustrated in FIG. 1.

Referring to FIG. 2, the column control signal generation unit 120 may include the delay unit 121 and the input/output strobe signal generation unit 123.

The delay unit 121 may be implemented with an inverter chain including a plurality of inverters. The delay unit 121 may generate the first strobe source signal IOSTB_S1 by delaying the column pulse signal CASP_RD by the first delay time, generate the column source signal YI_S by delaying the column pulse signal CASP_RD by the second delay time, and generate the second strobe source signal IOSTB_S2 by delaying the column pulse signal CASP_RD by the third delay time. The first strobe source signal IOSTB_S1 may be generated prior to the column source signal YI_S, and the column source signal YI_S may be generated prior to the second strobe source signal IOSTB_S2. The first strobe source signal IOSTB_S1 may have the opposite phase of the column pulse signal CASP_RD, and the second strobe source signal IOSTB_S2 may have the same phase as the column pulse signal CASP_RD.

Nodes of the inverter chain, which output the first and second strobe source signals IOSTB_S1 and IOSTB_S2 and the column source signal YI_S, may be changed based on a result obtained by simulating a voltage level difference between a local input/output line pair (not illustrated). That is, the first to third delay times may be changed.

The column source signal YI_S may be received by the column select signal generation unit 130. The column select signal generation unit 130 may generate the column select signal YI by decoding the column address C_ADD received from outside at a period in which the column source signal YI_S is activated.

The input/output strobe signal generation unit 123 may include a first NAND gate NAND1, a second NAND gate NAND2, and a third NAND gate NAND3. The first NAND gate NAND1 may receive the first strobe source signal IOSTB_S1 and the second strobe source signal IOSTB_S2. The second NAND gate NAND2 may receive an output signal of the first NAND gate NAND1 and a read control signal WTSB. The third NAND gate NAND3 may receive an output signal of the second NAND gate NAND2 and a strobe control signal DIS_IOSTB. The read control signal WTSB may be activated to a logic high level during a read operation. The strobe control signal DIS_IOSTB adjusts the pulse width of the input/output strobe signal IOSTBP, and the cycle of the strobe control signal DIS_IOSTB may be set by the current consumption and the voltage level difference ΔV between the local input/output line pair (not illustrated) based on the time during which the input/output sense amplification unit 140 is driven.

When the read control signal WTSB and the strobe control signal DIS_IOSTB are activated to a logic high level, the input/output strobe signal generation unit 123 may generate the input/output strobe signal IOSTBP having a logic high level at the time when the first and second strobe source signals IOSTB_S1 and IOSTB_S2 are activated to a logic high level.

The column control signal generation unit 120 of the semiconductor memory device in accordance with the embodiment of the present invention may generate the input/output strobe signal IOSTBP using the first and second strobe source signals IOSTB_S1 and IOSTB_S2. Thus, the semiconductor memory device does not need to include an internal delay logic circuit.

Now, referring to FIGS. 1 and 2, operation timings of the column control signal generation unit 120 illustrated in FIG. 2 will be described based on a high power supply voltage and a low power supply voltage applied thereto.

Figure 3:
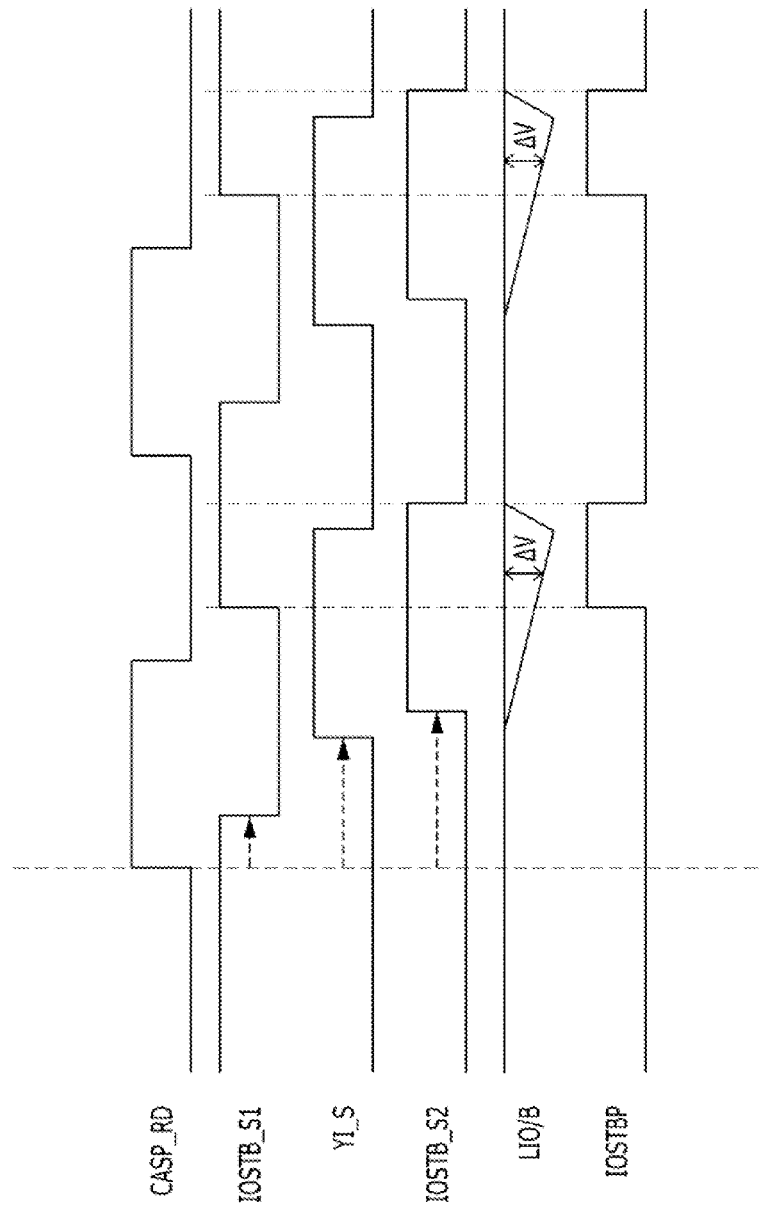
FIG. 3 is an operation timing diagram of the column control signal generation unit illustrated in FIG. 2 when a high power supply voltage is supplied thereto.

FIG. 3 is an operation timing diagram the column control signal generation unit 120 illustrated in FIG. 2 when a high power supply voltage is supplied thereto.

In FIG. 3, as an example, the first strobe source signal IOSTB_S1 is obtained by delaying the column pulse signal CASP_RD by the first delay time through the delay unit 121 and activated to have the opposite phase of the column pulse signal CASP_RD, and the column source signal YI_S is obtained by delaying the column pulse signal CASP_RD by the second delay time through the delay unit 121 and activated to have the same phase as the column pulse signal CASP_RD. Furthermore, in another example, the second strobe source signal IOSTB_S2 is obtained by delaying the column pulse signal CASP_RD by the third delay time through the delay unit 121 and activated to have the same phase as the column pulse signal CASP_RD.

The column source signal YI_S may be generated between the first strobe source signal IOSTB_S1 and the second strobe source signal IOSTB_S2. A rising edge of the first strobe source signal IOSTB_S1 may be activated at a period in which the column source signal YI_S is activated.

The input/output strobe signal IOSTBP may be activated at the time when both of the first and second strobe signals IOSTB_S1 and IOSTB_S2 are activated to a logic high level. Specifically, the input/output strobe signal IOSTBP may be activated during a period from a rising edge of the first strobe source signal IOSTB_S1 to a falling edge of the second strobe source signal IOSTB_S2. Thus, since the falling edge of the column source signal YI_S precedes the falling edge of the second strobe source signal IOSTB_S2, the input/output strobe signal IOSTBP may be generated at a period in which the column source signal YI_S is activated.

That is, in the case of the high power supply voltage, the input/output strobe signal generation unit 123 may activate the Input/output strobe signal IOSTBP at the time when a sufficient voltage level difference ΔV is secured between the local input/output line pair LIO/LIOB.

FIG. 4 is an operation timing diagram of the column control signal generation unit 120 illustrated in FIG. 2 when a low power supply voltage is supplied thereto.

In FIG. 4, the first strobe source signal IOSTB_S1 is obtained by delaying the column pulse signal CASP_RD by the first delay time through the delay unit 121 and activated to have the opposite phase of the column pulse signal CASP_RD, and the column source signal YI_S is obtained by delaying the column pulse signal CASP_RD by the second delay time through the delay unit 121 and activated to have the same phase as the column pulse signal CASP_RD. Furthermore, the second strobe source signal IOSTB_S2 is obtained by delaying the column pulse signal CASP_RD by the third delay time through the delay unit 121 and activated to have the same phase as the column pulse signal CASP_RD.

In the case of the low power supply voltage, the delay amount of the delay unit 121 may be increased more than in the case of the high power supply voltage in FIG. 3. Thus, the first and second strobe source signals IOSTB_S1 and IOSTB_S2 and the column source signal YI_S may be further delayed and generated.

The column source signal YI_S may be generated between the first strobe source signal IOSTB_S1 and the second strobe source signal IOSTB_S2. A rising edge of the first strobe source signal IOSTB_S1 may be activated at a period in which the column source signal YI_S is activated.

The column control signal generation unit 120 may generate the input/output strobe signal IOSTBP at a period in which both of the first and second strobe source signals IOSTB_S1 and IOSTB_S2 are activated to a logic high level. Specifically, the input/output strobe signal IOSTBP may be activated during a period from a rising edge of the second strobe source signal IOSTB_S2 to a falling edge of the first strobe source signal IOSTB_S1. Thus, since the rising edge of the second strobe source signal IOSTB_S2 precedes the falling edge of the column source signal YI_S, the input/output strobe signal IOSTBP may be activated at a period in which the column source signal YI_S is activated.

The column control signal generation unit 120 of the semiconductor memory device in accordance with the embodiment of the present invention may drive the input/output sense amplification unit 140 in response to the input/output strobe signal IOSTBP which is generated when a voltage level difference ΔV is secured between the local input/output line pair. Thus, the column control signal generation unit 120 may generate the input/output strobe signal IOSTBP when the sufficient voltage level difference ΔV is secured between the local input/output line pair, even through a process, voltage, or temperature variation occurs, thereby improving the reliability of the data output operation of the semiconductor memory device.

Although various embodiments have been described for illustrative purposes, it will be apparent to those skilled in the art that various changes and modifications may be made without departing from the spirit and scope of the invention as defined in the following claims.

What is claimed is:

1. A circuit of a semiconductor memory device, comprising:
    a delay unit suitable for delaying a column pulse signal, and sequentially generating a first strobe source signal, a column source signal, and a second strobe source signal at predetermined time intervals; and
    an input/output strobe signal generation unit suitable for generating an input/output strobe signal which is activated during a period in which both of the first and second strobe source signals are activated.

2. The circuit of claim 1, wherein the delay unit generates the first strobe source signal, the column source signal, and the second strobe source signal by delaying the column pulse signal by first to third delay times, respectively.

3. The circuit of claim 2, wherein the first delay time is less than the second delay time, and the second delay time is less than the third delay time.

4. The circuit of claim 2, wherein the first strobe source signal, the column source signal, and the second strobe source signal are activated at different times, and the column source signal is activated prior to the second strobe source signal.

5. The circuit of claim 1, wherein:
    the first strobe source signal has the opposite phase of the column pulse signal; and
    the column source signal and the second strobe source signal have the same phase as the column pulse signal.

6. The circuit of claim 2, wherein the delay unit comprises an inverter chain.

7. The circuit of claim 1, wherein the input/output strobe signal generation unit comprises:
    a first NAND gate suitable for performing a NAND operation on the first strobe source signal and the second strobe source signal;
    a second NAND gate suitable for performing a NAND operation on an output signal of the first NAND gate and a read control signal; and
    a third NAND gate suitable for performing a NAND operation on an output signal of the second NAND gate and a strobe control signal to output the input/output strobe signal.

8. A semiconductor memory device comprising:
    a column control signal generation unit suitable for generating an input/output strobe signal which is activated in response to first and second strobe source signals obtained by delaying a column pulse signal by predetermined delay times, respectively, and a column source signal which is activated prior to the second strobe source signal;
    a column select signal generation unit suitable for generating a column select signal corresponding to a column address in response to the column source signal; and
    an input/output sense amplification unit suitable for sensing and amplifying data signals of a local input/output line pair in response to the input/output strobe signal.

9. The semiconductor memory device of claim 8, wherein the column control signal generation unit comprises:
    a delay unit suitable for delaying the column pulse signal by first to third delay times, respectively, and sequentially generating the first strobe signal, the column source signal, and the second strobe source signal at predetermined time intervals; and
    an input/output strobe signal generation unit suitable for generating the input/output strobe signal which is activated during a period in which both of the first and second strobe source signals are activated, in response to the first and second strobe source signals.

10. The semiconductor memory device of claim 8, wherein:
    the first strobe source signal has the opposite phase of the column pulse signal; and
    the column source signal and the second strobe source signal have the same phase as the column pulse signal.

11. The semiconductor memory device of claim 9, wherein the delay unit comprises an inverter chain.

12. The semiconductor memory device of claim 9, wherein the input/output strobe signal generation unit comprises:
    a first NAND gate suitable for performing a NAND operation on the first strobe source signal and the second strobe source signal;
    a second NAND gate suitable for performing a NAND operation on an output signal of the first NAND gate and a read control signal; and
    a third NAND gate suitable for performing a NAND operation on an output signal of the second NAND gate and a strobe control signal to output the input/output strobe signal.

13. The semiconductor memory device of claim 12, wherein:
    the third NAND gate outputs the output signal of the second NAND gate as the input/output strobe signal when the strobe control signal is activated; and
    a cycle of the strobe control signal is set to adjust a pulse width of the input/output strobe signal.

14. An operating method of a semiconductor memory device, comprising:
    delaying a column pulse signal by a first delay time, and generating a first strobe source signal having the opposite phase of the column pulse signal;
    delaying the column pulse signal by a second delay time, and generating a column source signal having the same phase as the column pulse signal;
    delaying the column pulse signal by a third delay time, and generating a second strobe source signal having the same phase as the column pulse signal; and
    activating an input/output strobe signal during a period in which both of the first and second strobe source signals are activated.

15. The method of claim 14, wherein the first delay time is less than the second delay time, and the second delay time is less than the third delay time.

* * * * *